United States Patent
Ochiai et al.

(10) Patent No.: US 7,738,524 B2
(45) Date of Patent: Jun. 15, 2010

(54) SEMICONDUCTOR LASER DEVICE

(75) Inventors: Masanao Ochiai, Anan (JP); Koji Yuasa, Anan (JP)

(73) Assignee: Nichia Corporation, Anan-shi (JP)

( * ) Notice: Subject to any disclaimer, the term of this patent is extended or adjusted under 35 U.S.C. 154(b) by 991 days.

(21) Appl. No.: 11/494,444

(22) Filed: Jul. 28, 2006

(65) Prior Publication Data

US 2007/0025231 A1    Feb. 1, 2007

(30) Foreign Application Priority Data

Jul. 29, 2005    (JP) .............................. 2005-221338

(51) Int. Cl.
*H01S 5/00* (2006.01)

(52) U.S. Cl. ............... 372/49.01; 372/44.011

(58) Field of Classification Search ............ 372/44.011, 372/49.01
See application file for complete search history.

(56) References Cited

U.S. PATENT DOCUMENTS

| 6,396,864 | B1 | 5/2002 | O'Brien et al. |
| 2003/0183833 | A1 | 10/2003 | Osaka |

FOREIGN PATENT DOCUMENTS

EP    1164669 A1    12/2001

OTHER PUBLICATIONS

English language translation of JP 06-104526 (Apr. 15, 1994).
English language translation of JP 09-162497 (Jun. 20, 1997).
Holmes et al., Appl. Phys. Lett., vol. 66, No. 21, pp. 2831-2833, (1995).

*Primary Examiner*—Armando Rodriguez
(74) *Attorney, Agent, or Firm*—Birch, Stewart, Kolasch & Birch, LLP

(57) ABSTRACT

A semiconductor laser device, which has a protective film at an end surface thereof, is adaptable to demands for higher outputs or shorter wavelengths. The semiconductor laser device according to the present invention includes a dielectric film on at least one end surface of an optical resonator, in which the dielectric film includes a first dielectric layer and a second dielectric layer comprised of the same elements and disposed in sequence from the end surface side of the semiconductor, the first dielectric layer including a layer made of a single crystal material and the second dielectric layer including a layer made of an amorphous material.

20 Claims, 8 Drawing Sheets

SEMICONDUCTOR LASER DEVICE

BACKGROUND OF THE INVENTION

This application claims priority from the applications No. 2005-221338 filed in Japan on Jul. 29, 2005, the contents of which are incorporated hereinto by reference.

BACKGROUND OF THE INVENTION

1. Field of the Invention

The present invention relates to a semiconductor laser device, in particular, to a high output semiconductor laser device whose oscillation wavelength is 600 nm or less.

2. Description of the Related Art

Presently, high output semiconductor laser devices are in demand for use in writing onto optical discs and magnetic optical discs. Such semiconductor laser devices are required to operate stably for long time in a fundamental mode.

Also, in order to realize the shorter wavelengths necessary for higher recording density of optical discs, semiconductor laser devices using nitride semiconductors have been researched. The laser devices using the nitride semiconductors can be applied not only as a light source for optical discs, but also as light sources for exposure, printing, medical use, optical communication systems, measurement systems and the like. Also, with the laser devices having nitride semiconductors, the use in the ultraviolet region with the oscillation wavelength of 400 nm or less becomes possible, so that the application as a light source or the like in the bio-related area is also expected.

Japanese Unexamined Patent Application Publication No. H09-162497 discloses a configuration in which an $Al_2O_3$ layer of $\lambda/2$ in thickness is disposed on the reflecting mirror of the laser device, and a configuration in which an $Al_2O_3$ layer of $\lambda/4$ in thickness and an amorphous silicon layer of $\lambda/4$ in thickness are alternately stacked on the reflecting mirror of the laser device. Japanese Unexamined Patent Application Publication No. 2002-335053 discloses the use of $Al_2O_3$ as a dielectric film and the a method for disposing thereof.

However, when the $Al_2O_3$ layer of $\lambda/2$ in thickness is formed with a single layer, an amorphous $Al_2O_3$ layer may react with the semiconductor device under high output drive of 300 mW or higher, which leads to degradation of the end surfaces. Also, because of a large stress in a single crystal material $Al_2O_3$ film, heat generated during driving leads to separation of the $Al_2O_3$ film from the semiconductor device.

Also, in the semiconductor laser devices using the nitride semiconductors, if the dielectric layer of the end surface of the light emitting side is made of a single layer, destruction of the end surface tends to occur under high output operation such as at 30 mW or higher, resulting in a shortening the lifetime of the device. Moreover, in high output driving, the driving current becomes too large when the slope efficiency is low. A semiconductor laser device begins to oscillate the laser when strength of current applied to the laser device is increased and reaches a certain strength of current. As the current is increased, the laser output power is also increased. The slope efficiency usually means the ratio ($\Delta P/\Delta I$) of the increase of the laser output power ($\Delta P$) to the increase of current ($\Delta I$). The semiconductor laser device having the higher slope efficiency can obtain higher laser output power with lower current. On the contrary, a semiconductor laser device having lower slope efficiency needs higher current to obtain the higher laser output power. When the greater current is applied, heat can be generated at the laser device, and the heat can degrade or destroy the crystal. A reflectance ratio of the end surface of the light emitting side (front) and the slope efficiency can be adjusted by adjusting the refractive index and thickness of dielectric layer.

SUMMARY OF THE INVENTION

The present invention has been devised to solve the above problems, and is aimed at providing a semiconductor laser device which has an end surface protective coat adaptable to the high output or the short wavelength of the semiconductor laser device.

In one embodiment, the semiconductor laser device according to the present invention has a dielectric film on at least one end surface of an optical resonator, in which the dielectric film comprises a first dielectric layer and a second dielectric layer that contain a same element and are disposed in sequence from the end surface side of the semiconductor, and wherein the first dielectric layer includes a layer made of a single crystal material and the second dielectric layer includes a layer made of an amorphous material. Further, the first dielectric layer and the second dielectric layer have approximately the same composition ratio.

With the configuration described above, a layer made of a single crystal material is contained in the first dielectric layer that is directly contacted with the end surface of the resonator of the semiconductor laser device, so that decomposition of the semiconductor layer at the end surface can be prevented. Preferably, the first dielectric layer is made of a single crystal material layer. With this, the efficiency in preventing decomposition can be improved. Further, by having the second dielectric layer including a layer formed of an amorphous on the first dielectric layer, the adhesion between the semiconductor layer and the dielectric layer can be maintained. Preferably, the second dielectric layer is made of an amorphous material.

In another embodiment, the semiconductor laser device according to the present invention has a dielectric film on at least one end surface of an optical resonator, in which the dielectric film comprises a first dielectric layer and a second dielectric layer that contain a the same elements and are disposed in sequence from the end surface side of the semiconductor, wherein the first dielectric layer is a reaction preventing layer that prevents reaction between the semiconductor and the dielectric film and the second dielectric layer is a reflecting layer for a laser beam.

With the configuration described above, decomposition of the end surface of the semiconductor layer due to a reaction with the dielectric film can be prevented by the first dielectric layer that is in direct contact with the resonator end surface of the semiconductor laser device. Also, by providing the second dielectric layer made of a reflection coating of the laser beam on the first dielectric layer, confinement of light can be regulated easily with good reproducibility. The configuration described above is especially effective for a nitride semiconductor containing In (indium) in the active layer, because the active layer at the end surface of the resonator is prone to decompose.

In the semiconductor laser device described above, the first dielectric layer includes a layer made of a single crystal material. The first dielectric layer can contain a micro-crystallite and a polycrystalline. The second dielectric layer includes a layer made of an amorphous material.

In the semiconductor laser device described above, the first dielectric layer has lower refractive index than that of the second dielectric layer. It is considered that because the second dielectric layer includes a layer made of an amorphous material or the second dielectric layer is made of an amorphous material, an oxygen vacancy occurs in the second dielectric layer. With this arrangement, the adhesiveness of the dielectric layer can be secured.

In the semiconductor laser device described above, the second dielectric layer preferably has a higher layer thickness than that of the first dielectric layer. This is because with this arrangement, the second dielectric layer functions as an oxygen-blocking layer that suppresses the intrusion of the external oxygen.

In the semiconductor laser device described above, the refractive index of the dielectric film is preferably 25% or less. If the refractive index of the dielectric film disposed on the end surface of the emission (front) side, that is an optical resonator end surface of the semiconductor laser device, is 25% or below, a higher output laser can be obtained.

In the semiconductor laser device described above, the reflectance of the dielectric film is adjusted to 20% or less when the oscillation wavelength of the semiconductor laser device is approximately 400 nm. With this arrangement, a high output laser can be realized even in the nitride semiconductor laser devices.

In the semiconductor laser device described above, the first dielectric layer and the second conductive layer contain Al (aluminum) and O (oxygen) as constituent elements. With such an arrangement, a single crystal material layer and an amorphous layer can be formed in succession. Moreover, a pair-structure in which a single crystal material layer and an amorphous layer are alternately stacked can be made easily.

In the semiconductor laser device described above, the first dielectric layer and the second dielectric layer have approximately the same thermal expansion coefficients. Because the first dielectric layer and the second dielectric layer described above are made of the same material and have a common thermal expansion coefficient, occurrence of cracks in the dielectric layers can be prevented.

In the semiconductor laser device described above, the outermost layer of the dielectric layer is made of an nitride. With this arrangement, ambient oxygen can be prevented from entering into the first dielectric layer and the second dielectric layer, and further, into the semiconductor. Also, in a case where oxygen is included in the dielectric film except in the outermost layer thereof, elimination of oxygen from these layers can be prevented. With this arrangement, the optical reflectance of the dielectric film in continuous oscillation of the semiconductor laser device can be maintained.

In another embodiment, the semiconductor laser device according to the present invention has a dielectric film on at least one end surface of an optical resonator. The dielectric film comprises a first dielectric layer, a second dielectric layer and a third dielectric layer disposed in sequence from the end surface side of the semiconductor. The first dielectric layer and the second dielectric layer are comprised of the same elements, and the third dielectric layer contains an element different from that in the first dielectric layer and the second dielectric layer. The first dielectric layer functions as a reaction preventing layer that prevents a reaction between the semiconductor and the dielectric layer, and the second dielectric layer functions as a stress relaxation layer that relaxes stress between the first dielectric layer and the third dielectric layer.

With the configuration described above, decomposition of the end surface of the semiconductor layer due to a reaction with the dielectric film can be prevented by the first dielectric layer that is in direct contact with the resonator of the semiconductor laser device. Also, by providing the second dielectric layer, the third dielectric layer can be disposed easily as a desired dielectric layer on the outer surface of the second dielectric layer. Therefore, it becomes possible to adjust the degree of confinement of light.

In the semiconductor laser device described above, the first dielectric layer and the second dielectric layer contain oxygen.

In the semiconductor laser device described above, the oxygen content in the first dielectric layer is higher than that in the second dielectric layer.

In the semiconductor laser device described above, the outermost layer of the dielectric film is made of a nitride.

In the present invention, the term "approximately the same composition ratio" means the composition ratios need not to be identical, and it is preferable that difference in content of a material contained in both the first dielectric layer and the second dielectric layer is in a range of ±7%.

In the present invention, when the first dielectric layer includes a layer made of a single crystal material, the rate of content thereof can be adjusted to 75% or higher. Preferably, the rate of content of the layer made of a single crystal material is 80% or higher.

In the present invention, when the second dielectric layer includes a layer made of an amorphous material, the rate of content thereof is preferably adjusted to 75% or higher. However, in the emission region, 60% or higher of the rate of content of the layer made of an amorphous is sufficient.

As described above, according to the present invention, a high power semiconductor laser device can be provided by preventing the degradation of the end surface of the optical resonator and COD (catastrophic optical damage). COD is a phenomenon by which a crystalline is melted because of light absorption at the end surface of the light emitting side (front) of the device. This occurs when the light is absorbed at interface state of the end surface of the light emitting side (front) of the device, causing the temperature to exceed the melting point of the crystalline, and leading to melting and recrystallization of the semiconductor material at the facets of the laser. COD can be drastically accelerated by light absorption, leading to the increase of temperature, which causes bandgap shrinkage, which in turn causes further increase of light absorption. Thus, COD tends to depend on the output property of the laser device, and can progress easily in the direction of traveling of the light.

DETAILED DESCRIPTION OF THE PREFERRED EMBODIMENTS

Figure 1:
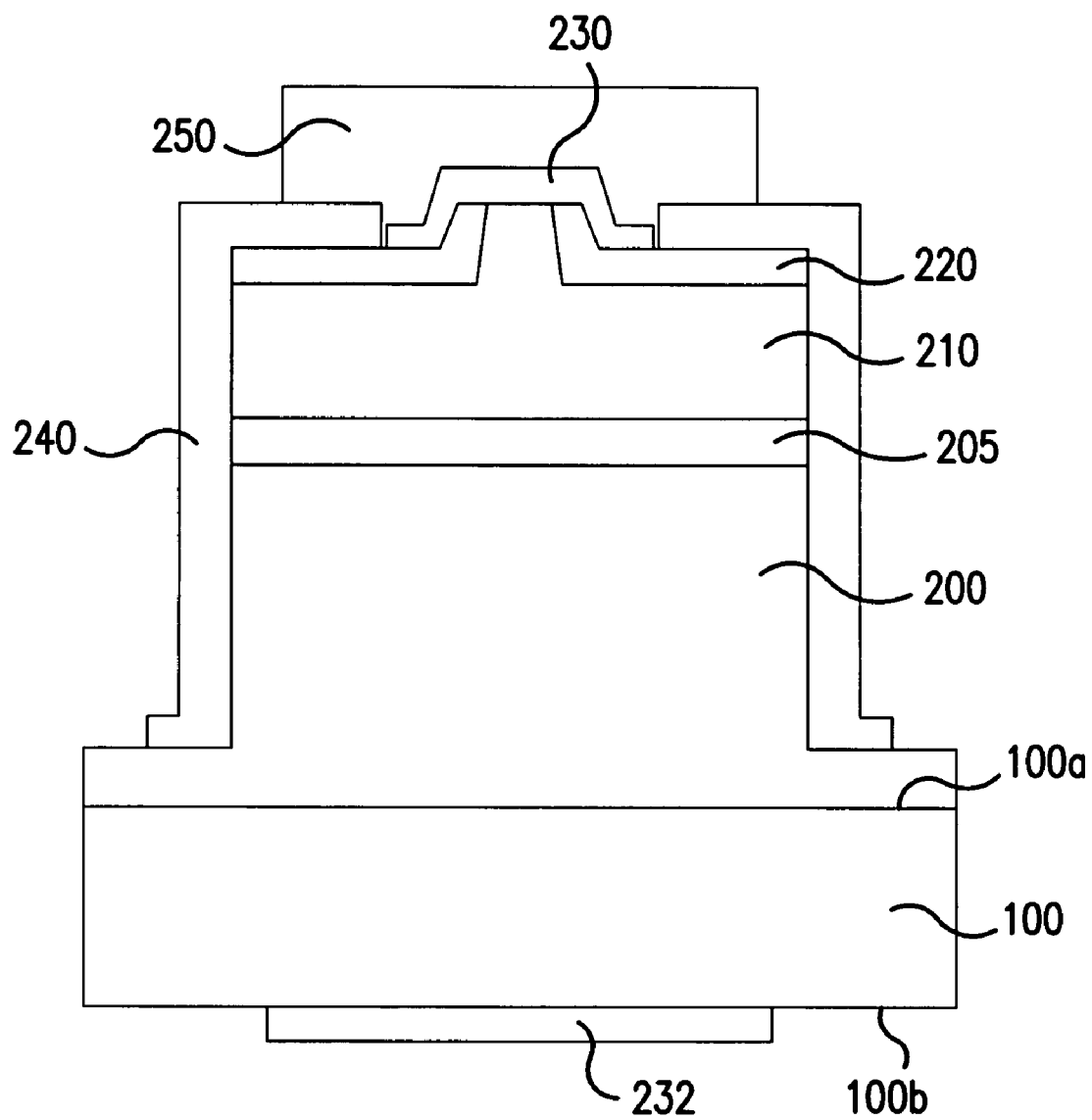
FIG. 1 is a schematic cross-sectional view of a nitride semiconductor laser device according to an embodiment of the present invention.
Figure 2:
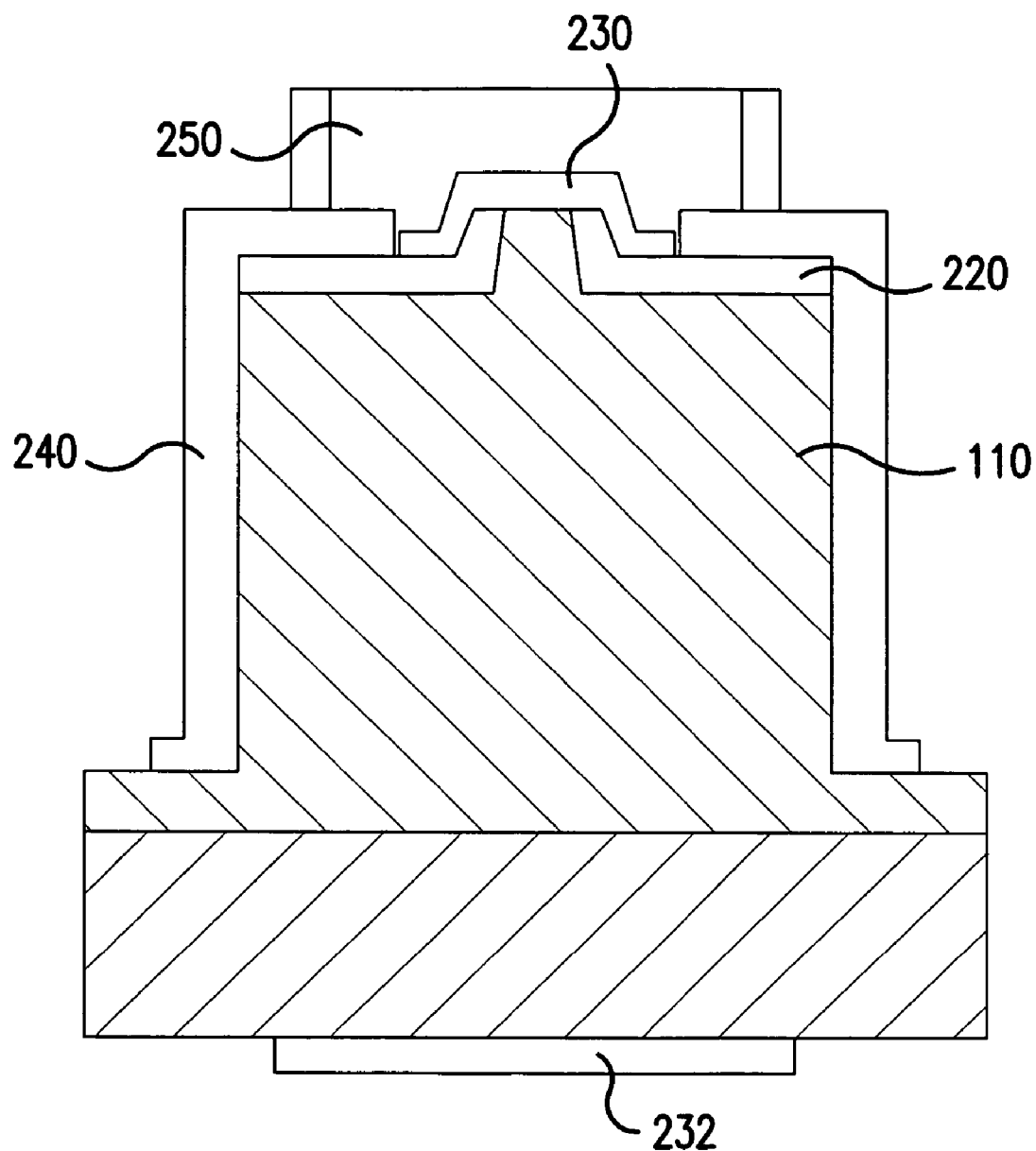
FIG. 2 is a schematic cross-sectional view of a nitride semiconductor laser device according to an embodiment of the present invention.

The preferred embodiments of the present invention will be described below with reference to the accompanying drawings. FIG. 1 and FIG. 2 are schematic cross-sectional view showing the structure of the semiconductor laser device using the nitride semiconductor according to the present embodiment.

As shown in FIG. 1, the semiconductor laser device of the present embodiment comprises an n-type nitride semiconductor layer 200, an active layer 205 and a p-type nitride semiconductor layer 210 stacked in this order on a first main surface of a substrate 100 comprising the first main surface 100a and a second main surface 100b. The cleaved end surfaces of the substrate 100 and the nitride semiconductor layer of the semiconductor laser device are substantially aligned, and as shown in FIG. 2, the end surface of the optical resonator is provided with a dielectric film 110. The dielectric film 110 is preferably disposed on the cleaved end surface of the nitride semiconductor layer and the substrate (see, for example, FIGS. 6 and 7).

Figure 5A:
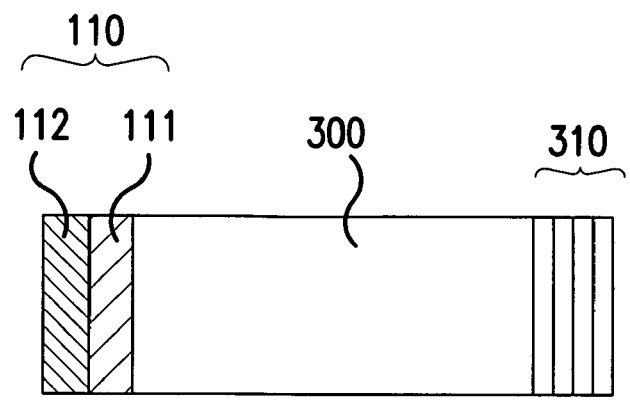
FIG. 5 is a schematic cross-sectional view of a dielectric film according to an embodiment of the present invention.

FIG. 5 shows a schematic perspective view of the dielectric film. The end surfaces of the optical resonator include the end surface of the light emitting (front) side and the end surface of the light reflecting (rear) side (see, for example, FIG. 5(a)). In the present embodiment, a dielectric film 110 is provided on the end surface of the light emitting side (see, for example, FIGS. 5(a) and (b)), but it is preferable that the dielectric film is also provided on the end surface of the light reflecting side. The dielectric film 110 comprises a first dielectric layer 111 and a second dielectric layer 112 comprised of the same elements and disposed in sequence from the end surface side of the semiconductor. It is preferable that the first dielectric layer 111 is made of a single crystal material layer and the second dielectric layer 112 is made of an amorphous material.

The semiconductor laser device has a counter electrode type structure in which a stripe-shape ridge and a p-electrode 230 thereon are provided to the p-type nitride semiconductor layer 210, and an n-electrode 232 is provided on a second main surface 100b of a substrate 100.

The dielectric film 110 contains at least one element selected from the group consisting of Al, Si, Nb, Ti, Zr, Hf, Ta, Zn, Y, Ga, and Mg. Preferably, the element is in the form of its oxide such as $Al_xO_y$ (1<x, 1<y), $SiO_x$ (1<x), $Nb_xO_y$ (1<x, 1<y), $TiO_x$ (1<x), and $ZrO_x$ (1<x). Examples thereof include $Al_2O_3$, $SiO_2$, $Nb_2O_5$, $TiO_2$, and $ZrO_2$.

In the present invention, if the electron diffraction image of the dielectric film analyzed by an Ultra-thin Film Evaluation System (HITACHI: HD-2000) shows a single spot, the dielectric layer is called an amorphous layer. If the crystallinity of the dielectric layer analyzed by the above-described system shows multiple spots in the diffraction pattern, the dielectric layer is called a single crystal material layer. Such an analysis can be conducted by casting a spot on an exposed dielectric layer of a specimen obtain by cutting the layered dielectric films in the direction perpendicular to the end surface of the light emitting side (see FIGS. 5(a)-(c)), using TEM.

The first dielectric layer is preferably a reaction preventing layer to prevent a reaction between the semiconductor and the dielectric film. Especially, in the nitride semiconductor laser device, a layer containing In is included in the active layer, and in the active layer at the end surface of the optical resonator could react with the dielectric film or could lead to decomposition of the active layer. However, according to the present invention, such problems can be prevented by providing the reaction preventing layer.

Further, the second dielectric layer is preferably a laser beam reflecting layer. With this arrangement, confinement of light in the optical resonator can be adjusted. When the first dielectric layer, which is a reaction preventing layer, is formed, the second dielectric layer can function as a reflection layer.

The thickness of the first dielectric layer is preferably in a range of from 30 Å to 500 Å, more preferably from 50 Å to 300 Å. With the thickness of the first dielectric layer in the range described above, the reaction prevention function can be obtained without causing separation of the layer.

The thickness of the second dielectric layer is preferably in a range of from 500 Å to 2000 Å, preferably from 700 Å to 1750 Å. It is more preferable that the total thickness of the first dielectric layer and the second dielectric layer is in a range from 1200 Å to 1800 Å. When the thickness of the second dielectric layer is in the range described above, a desired reflectance can be obtained easily.

Also, when the oscillation wavelength λ is approximately 400 nm, it is preferred that the first dielectric layer has a refractive index of 1.65 or less and the second dielectric layer has a refractive index higher than 1.65. With this arrangement, the COD level can be improved. In the present specification, the term "approximately 400 nm" means 390 nm to 415 nm.

For formation of the dielectric film, a film-forming method such as vacuum deposition method and sputtering method may be used. As a sputtering deposition apparatus, for example, an ECR sputtering apparatus, a magnetron sputtering apparatus and a radio frequency sputtering apparatus can be used.

An example of film-forming method for the dielectric film 110 will be illustrated below. A wafer with semiconductor layers stacked on a substrate is formed into bars to form optical resonator end surfaces, and each bar is placed in a deposition jig to form a dielectric layer with the deposition apparatus. In the present example, the dielectric layer is formed by using an ECR film deposition apparatus. Rare gas (Ar, He, Xe etc.), oxygen gas, and a metallic target can be used for the raw material. As the metallic target, Al or Zr, Si, Nb, Hf, Ti, or the like, with the purity of 3N (99.9%) or higher can be used. In a case where Al is used, it is preferable to use a material with the purity of 5N (99.999%) or higher for forming the dielectric layer.

Deposition of the first dielectric layer is carried out under the condition of higher oxygen content than deposition of the second dielectric layer. In deposition of the first dielectric layer, the microwave of 300 up to 800 W, Rf of 300 up to 800 W, rare gas flow rate of 10 up to 50 sccm (standard cubic centimeter minute), and oxygen gas flow rate of 5 to 20 sccm are preferable conditions. With these film deposition conditions, the first dielectric layer of single-crystal can be obtained.

In deposition of the second dielectric layer, a microwave of 300 up to 800 W, Rf of 300 up to 800 W, rare gas flow rate of 10 up to 50 sccm, and oxygen gas flow rate of 2 to 10 sccm may be used. The oxygen gas flow rate is lower than in the deposition of the first dielectric layer. When the layer is formed with this condition, an amorphous layer can be included in the second dielectric layer. Also, with the oxygen gas flow rate of less than 5 sccm, the second dielectric layer can be made as an amorphous layer. In the second dielectric layer, the oxygen content relative to a metal is equal or less compared to that in the first dielectric layer.

As for other conditions, the ambient pressure for layer deposition is preferably controlled within a range from 0.01 Pa to 1 Pa. Moreover, the deposition speed of the first dielectric layer is preferably set to 1 nm/min or higher. The deposition speed of the second dielectric layer can be set to 5 nm/min or higher. With the above-described conditions, a layer made of a single crystal material and a layer made of an amorphous material can be formed.

The dielectric film may be formed on the end surface of the light emitting side (front) and the end surface of the light reflecting side simultaneously, or may be formed respectively with different conditions.

The nitride semiconductor layer of the present embodiment includes an n-type nitride semiconductor layer 200, an active layer 205, and a p-type nitride semiconductor layer 210 formed in sequence from the substrate 100 side. However, the present invention is not construed to be limited in this structure. A p-type nitride semiconductor layer, an active layer and an n-type semiconductor layer may be formed in sequence from the substrate side. Also, the active layer 205 may be constructed with a multiple quantum well structure or a single quantum well structure. The nitride semiconductor layer described above is preferably constructed with a SCH (Separate Confinement Heterostructure) structure, in which the active layer is located between the n-type nitride semiconductor layer and the p-type nitride semiconductor. In this structure, an optical guide layer having a wider band-gap than that in the active layer is provided to above and below the active layer, so as to construct an optical waveguide.

The nitride semiconductor layer described above is represented by general formula $In_xAl_yGa_{1-x-y}N$ ($0 \leq x \leq 1$, $0 \leq y \leq 1$, $0 \leq x+y \leq 1$). In addition, as a group III element, B may be contained in some portion. Also, as a group V element, a part of N may be substituted with P or As. The n-type nitride semiconductor layer contains at least one element of group IV element such as Si, Ge, Sn, S, O, Ti, Zr and Cd, or group VI element, as the n-type dopant. The p-type nitride semiconductor layer contains, as the p-type dopant, Mg, Zn, Be, Mn, Mn, Ca, or Sr etc. The concentration of the dopant is preferably in a range between $5 \times 10^{16}/cm^3$ and $1 \times 10^{21}/cm^3$.

The growth method of the nitride semiconductor layer is not specifically limited and any known methods for growing a nitride semiconductor such as MOVPE (metalorganic vapor phase epitaxial growth method), MOCVD (organic metal chemistry gaseous phase growth method), HVPE (hydride vapor physe epitaxy) and MBE (molecular beam epitaxy) can be used suitably. Especially, MOCVD is preferable, because good crystallinity can be obtained by using this method. Also, it is preferable that the nitride semiconductor is grown by using a growth method that is selected properly according to its purpose.

Figure 11:
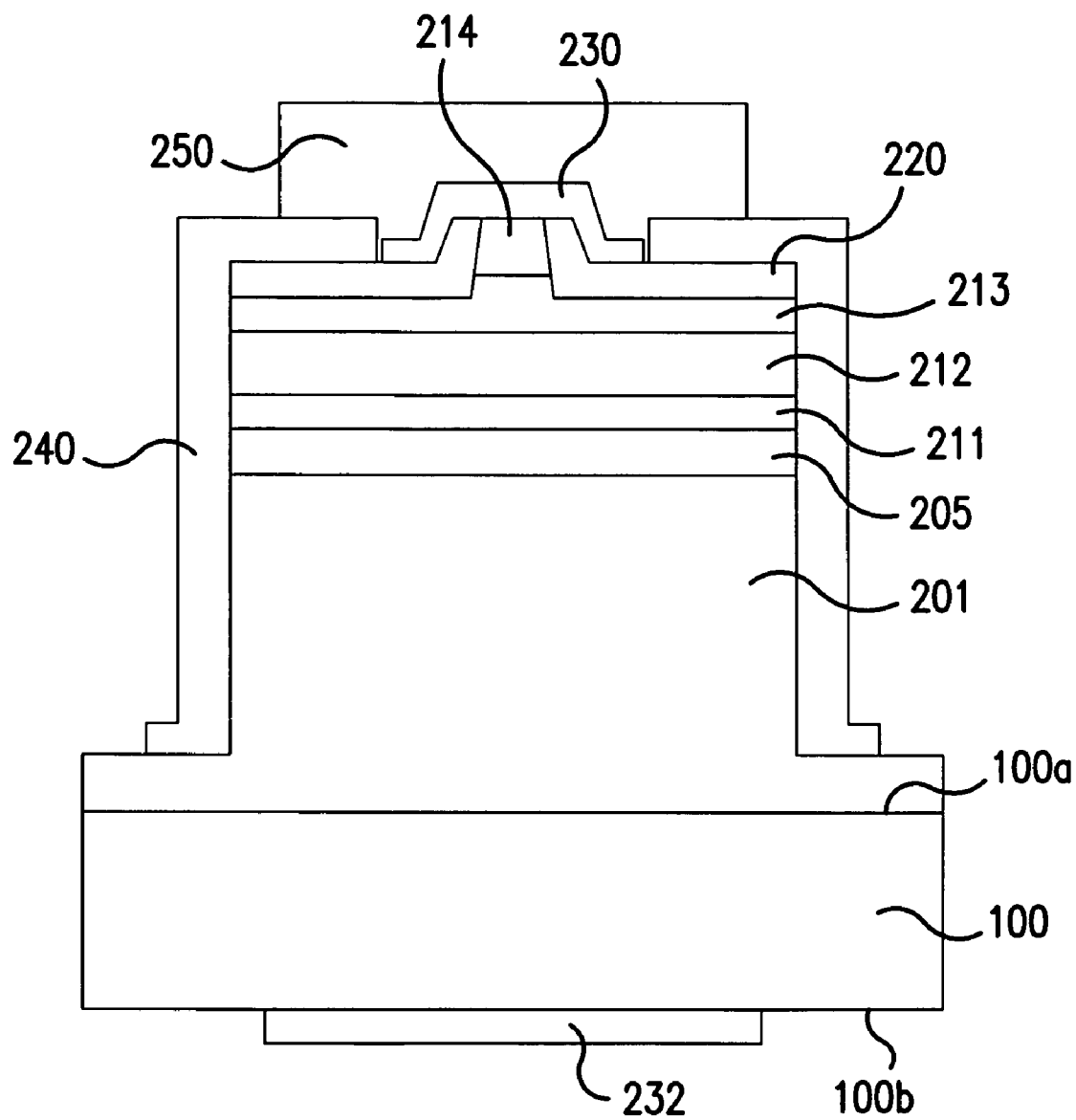
FIG. 11 is a schematic cross-sectional view of a nitride semiconductor laser device according to an embodiment of the present invention.

Hereinafter, a fabricating method for the semiconductor laser device of the present embodiment will be described by referring a nitride semiconductor. However, the present invention is not be limited by the construction described below. A schematic cross sectional view of a nitride semiconductor laser device fabricated with the conditions described below is shown in FIG. 11.

(First Process)

First, a substrate 100 having a first main surface and a second main surface is prepared. The substrate 100 having an off-angle of 0.05° to 1.0° in the first main surface and/or the second main surface is used for the substrate 100. The thickness of the substrate 100 is set to in a range from 50 μm to 1 mm, preferably from 100 μm to 500 μm. As the substrate, on which the nitride semiconductor is grown, a nitride semiconductor substrate 100 is preferably used. Examples of the fabrication method for the nitride semiconductor substrate 100 include a vapor growth method such as MOCVD method, HVPE method and MBE method, a hydrothermal method in which crystal is grown in a supercritical pressure fluid, a high-pressure method, a flux growth method, and a fusion method.

The first main surface of the nitride semiconductor substrate 100 is preferably C(0001) plane, M(1-100) plane and A(11-20) plane. When the first main surface of the nitride semiconductor substrate 100 is C(0001) plane, the second main surface is (000-1) plane. The number of dislocation per unit area in the nitride semiconductor substrate 100 is $5 \times 10^6/cm^2$ or less with CL observation and TEM observation. Also, in the nitride semiconductor substrate 100, the full width at half maximum of (0002) diffracted X-ray locking curve obtained by using a biaxial crystal method is 2 minutes or less, preferably 1 minute or less. The curvature radius of the nitride semiconductor substrate 100 is 1 m or more.

The first main surface and/or the second main surface of the nitride semiconductor substrate are subjected to polishing and laser irradiation in order to form an off-angle of 0.05° to 1.0°, preferably of 0.1° to 0.7°. When the off-angle is formed in this range, the device characteristics can be stabilized with the oscillation wavelength of the laser device in a range between an ultraviolet region of 365 nm or less and a long wavelength region of 500 nm or more. Specifically, the composition distribution in the active layer within a chip can be made uniformly. In the present specification, the bar (−) in parentheses indicating the plane indices represents the overbar that is supposed to be on the following number thereof.

(Second Process)

Next, a nitride semiconductor layer is grown on the first main surface 100a, which has an off-angle, of the nitride semiconductor substrate. Each layer that will be described below is grown by using a MOCVD method under the condition of reduced pressures or atmospheric pressure. The nitride semiconductor layer includes an n-type nitride semiconductor layer 200, an active layer 205, and a p-type nitride semiconductor layer 210, stacked in this order on the first main surface of the nitride semiconductor substrate 100. The n-type nitride semiconductor layer 200 formed on the first main surface 100a of the nitride semiconductor substrate 100 is a multilayer layer. The n-type nitride semiconductor layer 201 is $Al_xGa_{1-x}N$ ($0<x \leq 0.5$), preferably $Al_xGa_{1-x}N$ ($0<x \leq 0.3$). Specific growth condition includes the growth temperature in the reactor of 1000° C. or higher and the pressure of 600 Torr or less. The first n-type nitride semiconductor layer 201 can also function as a cladding layer. The layer thickness is adjusted to in a range from 0.5 to 5 μm. Next, the second n-type nitride semiconductor layer 202 is formed. The second n-side nitride semiconductor layer is $Al_xGa_{1-x}N$ ($0 \leq x \leq 0.3$) that functions as an optical guide layer. The layer thickness thereof is adjusted to in a range from 0.5 to 5 μm.

The n-type nitride semiconductor layer may include an intermediate layer made of $In_xAl_yGa_{1-y}N$ ($0<x\leq1$, $0\leq y<1$, $0<x+y\leq1$). In addition, the intermediate layer may have a single-layer structure or a multilayer structure.

The active layer 205 is represented by general formula $In_xAl_yGa_{1-y}N$ ($0<x\leq1$, $0\leq y<1$, $0<x\leq1$), in which at least In is included. Rising the Al content enables the emission in ultraviolet region. Moreover, emission in longer wavelengths side also becomes possible. That is, emission of 360 nm to 580 nm becomes possible. Also, when the active layer is formed with a quantum well structure, the luminous efficiency will be improved. Here, in the composition of the well layer, the mixed crystal of In is $0<x\leq0.5$. The thickness of the well layer is 30 to 200 angstroms, preferably 30 to 100 angstroms. The thickness of the barrier layer is 20 to 300 angstroms, preferably 70 to 200 angstroms. The multiple quantum well structure of the active layer may start with a barrier layer and end with a well layer, may start with a barrier layer and end with a barrier layer, may start with a well layer and end with a barrier layer, or may start with a well layer and end with a well layer.

Next, the p-type nitride semiconductor layer 210 is formed on the active layer. The first p-type nitride semiconductor layer 211 is $Al_xGa_{1-x}N$ ($0\leq x\leq0.5$) that contains a p-type dopant. The first p-type nitride semiconductor layer functions as the p-side electron confining layer. Next layers are the second p-type nitride semiconductor layer 212 of $Al_xGa_{1-x}N$ ($0\leq x\leq0.3$), and the third p-type nitride semiconductor layer 213 of $Al_xGa_{1-x}N$ ($0<x\leq0.5$) including a p-type dopant. The third p-type nitride semiconductor layer is preferably of a super lattice structure and functions as the cladding layer. Specifically, the third p-type nitride semiconductor layer includes an $Al_xGa_{1-x}N$ ($0\leq x<1$) layer and an $Al_xGa_{1-x}N$ ($0<y\leq1$, $x<y$) layer. Then, the fourth p-type nitride semiconductor layer 214 of $Al_xGa_{1-x}N$ ($0\leq x\leq1$) containing a p-type dopant is stacked in sequence. Also, In may be included in the above-described semiconductor layers as a mixed crystal. The first p-type nitride semiconductor layer 211 is omissible. The layer thickness of the above-described layers are set to in a range from 30 Å to 5 μm.

After completing the reaction, the wafer is annealed at 700° C. or higher in a nitride atmosphere in a reaction chamber in order to reduce the resistance of the p-type layer.

The n-type nitride semiconductor layer and the p-type nitride semiconductor layer may respectively have a superlattice structure consisting of two layers having different composition ratios.

(Third Process)

The wafer having the nitride semiconductor layers formed on the nitride semiconductor substrate 100 is removed from the reaction vessel. Next, the p-type nitride semiconductor layer 200 is exposed by etching. With this etching, the length of resonator is formed with 200 μm to 1500 μm and the width of the chip is formed with 150 μm to 500 μm. The location of the n-type nitride semiconductor layer to be exposured is not specifically limited. In the present embodiment, the first nitride semiconductor layer 201 is exposed. With this, stress between the nitride semiconductor substrate and the nitride semiconductor layers formed on the nitride semiconductor substrate can be relaxed effectively. This process can be omitted. Concurrently with this etching, a W-shaped groove 120 may be formed near the end surface of the light emitting side. With this W-shaped groove, stray light can be prevented from being emitted from the end surface. Concurrently with the etching, cleave-assist grooves for cleavage may be formed at the four corners of the device. By providing the cleavege-assist grooves, process to make wafer into bars, and further into chips can be carried out easily. In etching, RIE method is employed and etching is carried out by using a gas such as $Cl_2$, $CCl_4$, $BCl_3$, and $SiCl_4$.

Next, a stripe-shaped 150 ridge is formed in the p-type nitride semiconductor layer. The width of the ridge portion, which is the waveguide region, is controlled within a range from 1.0 μm to 30.0 μm. For single-mode laser beam, the width of the ridge portion is preferably 1.0 μm to 3 μm. The height of the ridge (the depth of etching) is required to be in a range in which at least the third p-type nitride semiconductor layer 213 is exposed, and may be to the extent where the first p-type nitride semiconductor layer 211 is exposed.

Then, a first insulating layer 220 is disposed on the exposed surface of the p-type nitride semiconductor layer. The first insulating layer 220 is preferably disposed on the side surface of the ridge. The first insulating layer 220 is selected from insulating materials having smaller refractive index than that of the nitride semiconductor layer. Specific examples includes oxides or nitrides of Zr, Si, V, Nb, Hf, Ta or Al etc.

Then, a p-electrode 230 is disposed on the surface of the p-type nitride semiconductor layer 214. Preferably, the p-electrode 230 is disposed only on the fourth nitride semiconductor layer 214. The p-electrode is made with a multilayer structure. For example, when the p-electrode has double-layered structure of Ni and Au, first, Ni is disposed on the fourth nitride semiconductor layer to a layer thickness of 50 Å to 200 Å and then, Au is disposed to a layer thickness of 500 Å to 3000 Å. When the p-electrode is made with a three-layered structure, the layers are disposed in sequence of Ni/Au/Pt or Ni/Au/Pd. When the p-layer is made with a three-layered structure, Ni and Au are made with the same layer thickness as in the double-layered structure and the final layer of Pt or Pd is made to a thickness of 500 Å to 5000 Å. In addition, after disposing the p-electrode 230, ohmic annealing may be carrier out. As the annealing condition, the annealing temperature can be set to 300° C. or higher, preferably 500° C. or higher. The annealing is carried out under an atmosphere containing nitrogen and/or oxygen.

It is preferable that the end surface of the p-electrode is substantially aligned with the end surface of the light emitting side. However, as shown in FIG. 3, the end surface of the p-electrode 230 may be located at about 10 μm away from the end surface of the light emitting side.

Next, a second insulating layer 240 is disposed on a side surface, etc. of the n-type nitride semiconductor layer, which is exposed, by the previous process. The second insulating layer is made of $ZrO_2$ or $SiO_2$, or an oxide of V, Nb, Hf, Ta and Al etc.

Figure 3:
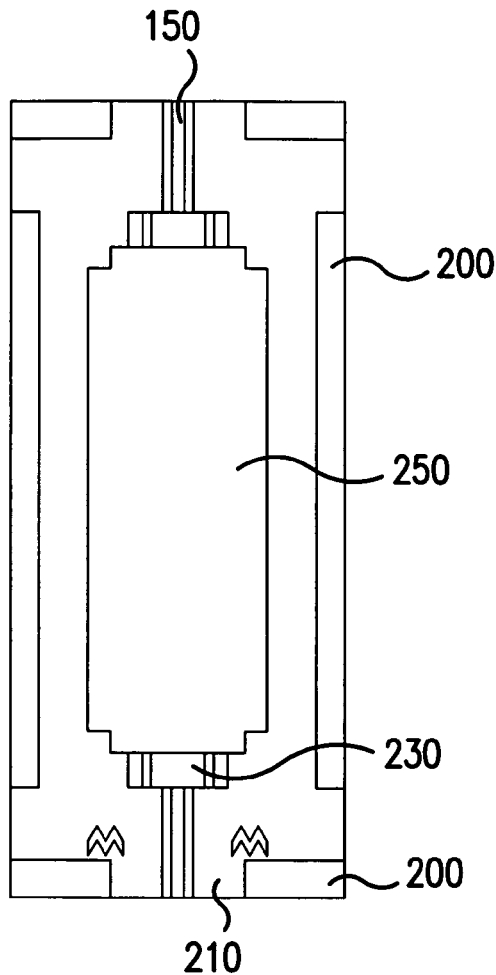
FIG. 3 is a schematic plan view of a nitride semiconductor laser device according to an embodiment of the present invention.

Next, a pad electrode 250 is disposed on the p-electrode 230 (FIG. 3). Here, in the plan view shown in FIG. 3, the first insulating layer 220 and the second insulating layer 240 are omitted. Also, the pad-electrode is preferably has a layered structure made of metals such as Ni, Ti, Au, Pt, Pd and W. For example, the pad electrode is disposed in sequence of W/Pd/Au, Pt/Ti/Au, or Ni/Ti/Au, from the p-electrode side. The thickness of the pad electrode is not specifically limited. However, the thickness of the final layer of Au is adjusted to 1000 Å or more.

(Fourth Process)

Thereafter, the above described n-electrode 232 is disposed on the second main surface 100b of the nitride semiconductor substrate. By polishing the substrate from the second main surface side, the thickness of the substrate is made to 100 μm or less. Next, the n-electrode is disposed with a multilayer by way of sputtering etc. An alloy or layered structure containing at least one selected from the group consisting of V, Mo, Ti, Cr, W, Al, Zr, Au, Pd, Rh, Nb, Hf, Ta, Re, Mn, Zn, Pt and Ru can be used for the n-electrode 232. Preferable structure is a two-layer structure or a three-layer structure such as V/Pt/Au, Ti/Pt/Au, Mo/Pt/Au, W/Pt/Au, Ti/Pd/Al, Ti/Al, Cr/Au, W/Al and Rh/Al. In addition, Ti, Mo, Si, W, Pt, Ni, Rh or an oxide or nitride thereof may be formed to the surface of the n-electrode as a barrier. The mounting strength of the chip can be enhanced.

As for the thickness of the n-electrode, for example, the first layer is disposed with a thickness of about 100 Å, by using V. The second layer is disposed with a thickness of about 2000 Å by using Pt, and the third layer is disposed with a thickness of about 3000 Å by using Au. Other than sputtering, CVD or vapor deposition may be used for disposing the layers. In addition, after disposing the n-electrode, annealing may be performed at 500° C. or higher.

After disposing the n-electrode 232, a metalized electrode may further be disposed. For the metalized electrode, Ti—Pt—Au—(Au/Sn), Ti—Pt—Au—(Au/Si), Ti—Pt—Au—(Au/Ge), Ti—Pt—Au—In, Au/Sn, In, Au/Si, Au/Ge and the like can be used.

After disposing the n-electrode 232, the wafer is divided into bar-shaped pieces in the direction perpendicular to the stripe-shaped p-electrode 230, in order to form the end surface of the resonator of the nitride semiconductor. In this case, the end surface of the resonator is arranged to M-plane (1-100) or A-plane (11-20). The wafer is divided into bar-shaped pieces by way of blade-break, roller-break or press-break.

The dividing process of the wafer may also be carried out in two processes. With this method, the end surface of the resonator can be formed with good yield. First, cleavege-assist grooves are formed by way of etching and the like from the first main surface side or the second main surface side of the substrate. The cleavege-support grooves are formed in the four corners of the device to be made into chips. With this, the direction of the cleavage can be prevented from winding. Next, the wafer is divided into bar-shaped pieces by a breaker.

(Fifth Process)

Figure 4:
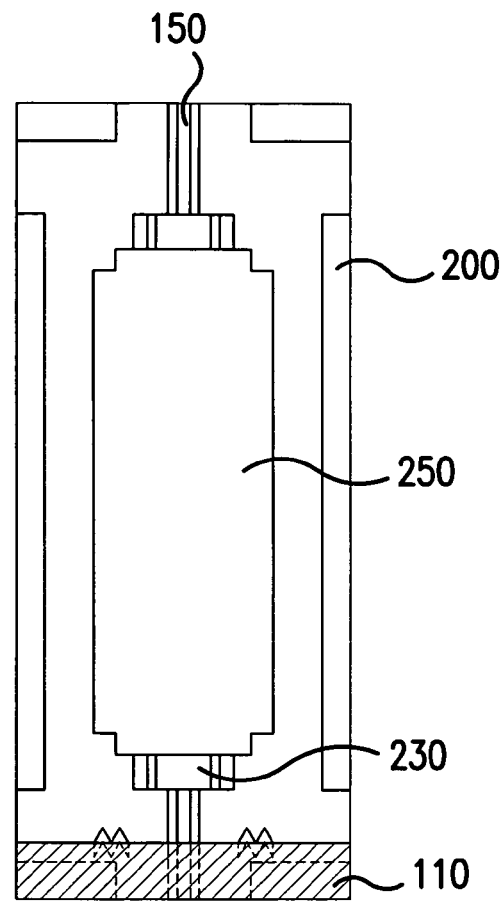
FIG. 4 is a schematic plan view of a nitride semiconductor laser device according to an embodiment of the present invention.
Figure 5B:
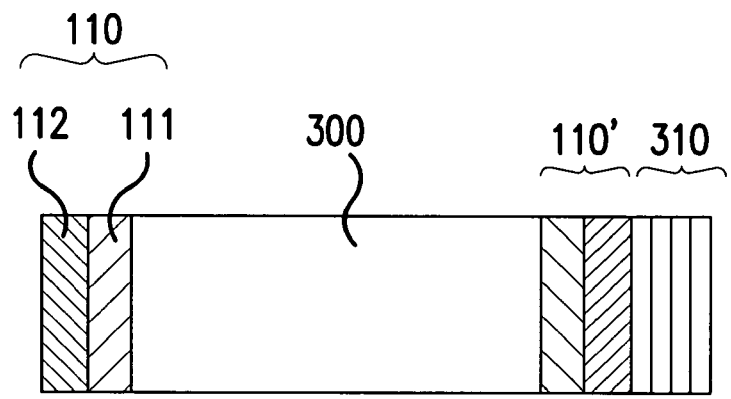
Figure 6:
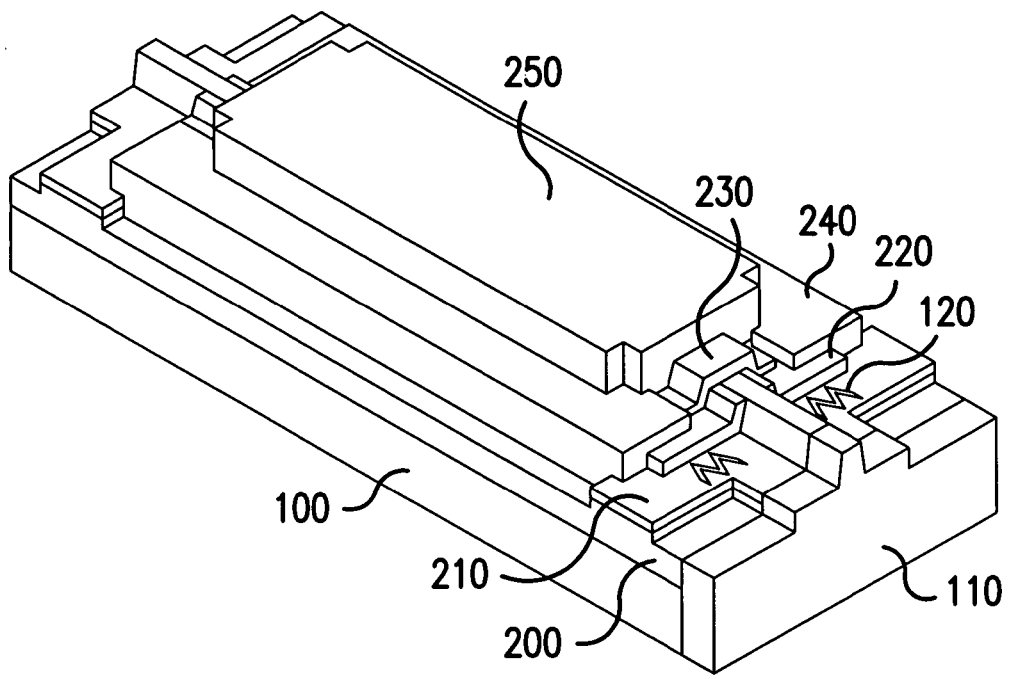
FIG. 6 is a schematic perspective view of a nitride semiconductor laser device according to an embodiment of the present invention.
Figure 7:
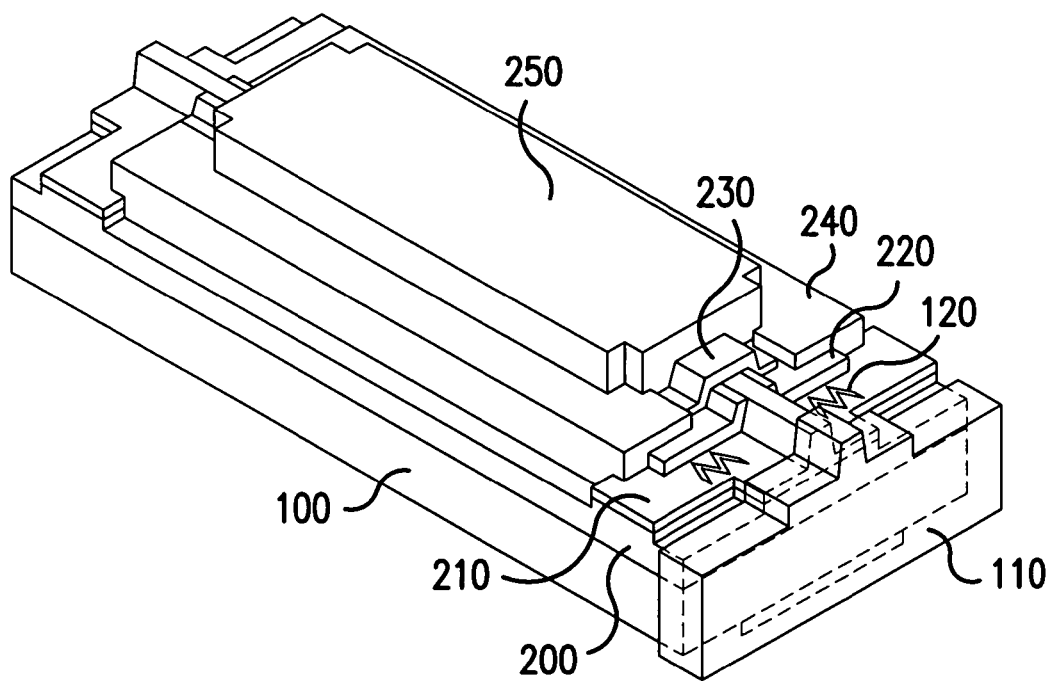
FIG. 7 is a schematic perspective view of a nitride semiconductor laser device according to an embodiment of the present invention.
Figure 8:
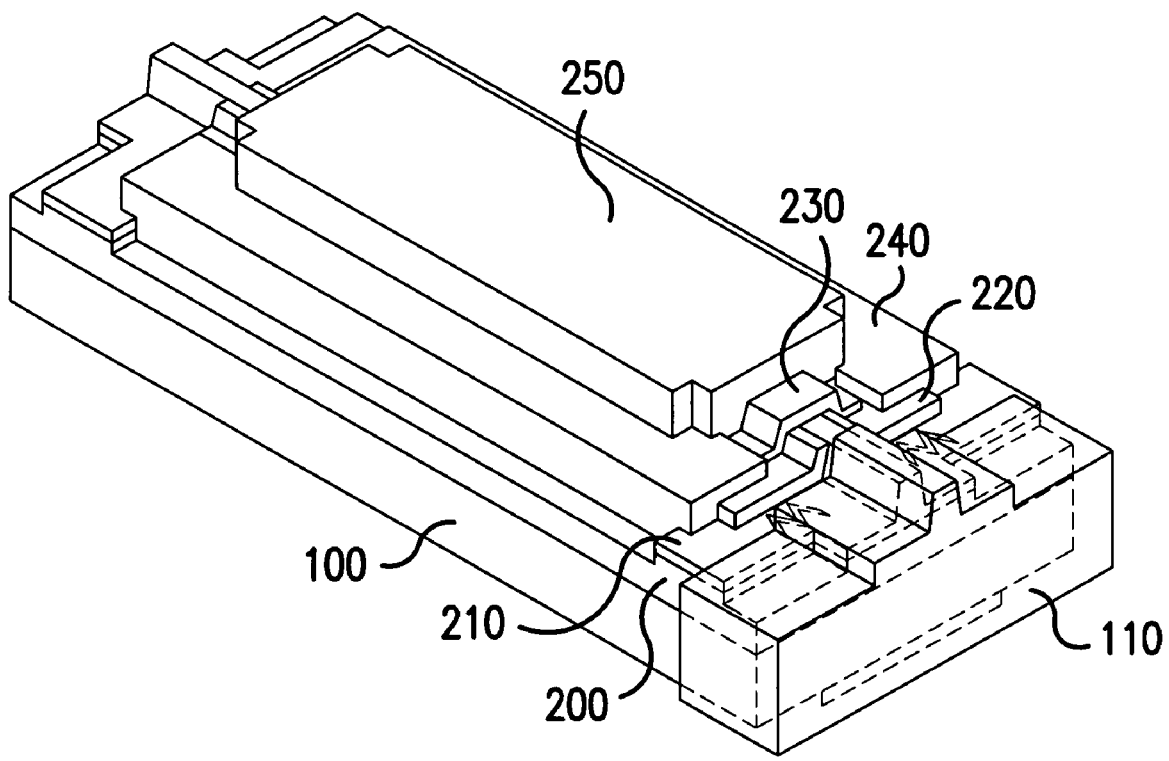
FIG. 8 is a schematic perspective view of a nitride semiconductor laser device according to an embodiment of the present invention.

Next, the above-described dielectric film 110 is formed on the end surface of the resonator. FIG. 4 shows a plan view of a nitride semiconductor laser device with the dielectric film 110 formed on the end surface of the light emitting side. The dielectric film 110 may also have a configuration in which after sequentially forming a first dielectric layer 111 and a second dielectric layer 112 on the end surface of the light emitting side, a dielectric film 110' is also formed on the end surface of the light reflecting side (see FIG. 5). FIG. 6 shows a perspective view of a nitride semiconductor laser device with the dielectric film 110 formed on the end surface of the light emitting side. FIG. 7 shows a case in which the dielectric film 110 extends to the side surfaces of a nitride semiconductor laser device. With such configuration, degradation of not only the end surface of the nitride semiconductor but also the side surfaces thereof can be prevented. Further, as shown in FIG. 8, there is a case in which the dielectric film is extended as if to cover the electrode. With such configuration, degradation of the side surfaces can also be prevented effectively.

After disposing the dielectric film 110 comprising the first dielectric layer 111 and the second dielectric layer 112 on the end surface of the light emitting side of the semiconductor 300, a reflecting mirror 310 is disposed (FIG. 5a) on the end surface of the light reflecting side. The reflecting mirror 310 has the reflectivity of 85% or higher and has a pair-structure of a layer with low refractive index and a layer with high refractive index. The reflectivity of the end surface of the light reflecting side is preferably set to 90% or higher, and more preferably 95% or higher.

Examples of other structures include a structure in which after disposing the dielectric film 110' including the first dielectric layer 111' and the second dielectric layer 112' in order from the end surface of the light reflecting side of the semiconductor 300, a reflecting mirror 310 is disposed. With such construction, life performance (life period) can be improved (FIG. 5b).

Figure 5C:
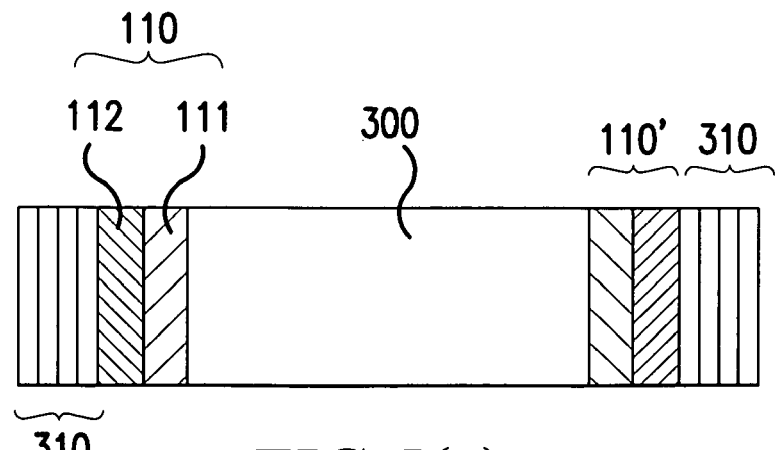

Further, as other construction, after disposing the dielectric film 110 on the end surface of the light emitting side of the semiconductor 300, a reflection mirror 310 is also disposed on the surface thereof (FIG. 5c). The reflection mirror has a pair-structure of a layer with low refractive index and a layer with high refractive index, such as a pair-structure of $SiO_2$ and $ZrO_2$. The number of pairs can be 2 to 10, and preferably 3 to 8, further preferably 6. As other materials, a compound such as an oxide, a nitride, or a fluoride of Si, Mg, Al, Hf, Nb, Zr, Sc, Ta, Ga, Zn, Y, and B can be used.

(Sixth Process)

After disposing the dielectric film on the end surface of the resonator of the bar-shaped semiconductor, the bar is divided into chips to obtain the nitride semiconductor laser devices. The shape of the nitride semiconductor laser device chip is set to be rectangular and the length of the rectangular resonator is adjusted to 650 μm or below. The nitride semiconductor laser device thus obtained has the COD level of 1 W and above and the kink power of 500 mW (the value of power at which the line shows kink at the graph of power with current). A life test (Tc=70° C., output power of 100 mW at CW) was performed and the result of 5000 hours and more was obtained.

Further, the nitride semiconductor laser device of the present invention has a counter electrode structure in which the contact resistance has been reduced, and the contact resistivity thereof is controlled to $1.0\ E^{-3}\ \Omega cm^2$ or below.

In the following, the semiconductor laser devices employing nitride semiconductor will be described as examples. Herein, the present invention is not limited to the examples described below and it is needless to say that various changes based on the technical idea of the present invention are possible.

EXAMPLE 1

For the substrate, a wafer-shaped GaN substrate 100 whose main surface is C-plane is used. The substrate is not specifically limited to the above and a GaN substrate whose main surface is R-plane or A-plane can be used according to need.

(n-Type Cladding Layer 201)

Next, the GaN substrate is fed into a MOCVD apparatus. At the atmospheric temperature in the furnace of 1050° C., using TMA (trimethylaluminum), TMG (trimethylgallium) and ammonia as the raw material gases, an n-type cladding layer of undoped $Al_{0.04}Ga_{0.96}N$ is grown to the thickness of 2.0 μm on the GaN substrate.

(n-Type Optical Guide Layer 202)

Next, at approximately the same temperature as in growing the n-type cladding layer and using TMG and ammonia as the raw material gases, an n-type optical guide layer of undoped GaN is grown to a thickness of 0.19 μm. This layer may be doped with an n-type dopant.

(Active Layer 205)

Next, at the temperature of 800° C. and using TMI, TMG and ammonia as the raw material gases and silane gas as a dopant, a barrier layer of Si-doped $In_{0.02}Ga_{0.98}N$ is grown to a thickness of 140 Å. Then the silane gas is stopped and a well layer of undoped $In_{0.1}Ga_{0.98}N$ is grown to a thickness of 80 Å. This sequence of depositions is repeated twice and finally, a Si-doped $In_{0.02}Ga_{0.98}N$ barrier layer is deposited to a thickness of 140 Å. Thus, an active layer with a total thickness of 580 Å having a multi-quantum well (MQW) structure is provided.

(p-Type Electron Confining Layer 211)

At a similar temperature and in a $N_2$ atmosphere, a p-type electron confining layer of Mg-doped $Al_{0.25}Ga_{0.75}N$ is grown to a thickness of 30 Å. Next, in a $H_2$ atmosphere, a p-type electron confining layer of Mg doped $Al_{0.25}Ga_{0.75}N$ is grown to a thickness of 70 Å.

(p-Type Optical Guide Layer 212)

Next, at a temperature of 1050° C. and using TMG and ammonia as the raw material gases, a p-type light guide layer of undoped GaN is grown to a thickness of 0.13 μm.

(p-Type Cladding Layer)

Subsequently, A-layer of undoped $Al_{0.08}Ga_{0.92}N$ is grown to a thickness of 80 Å and B-layer of Mg-doped GaN is grown to a thickness of 80 Å on the A-layer. This sequence of depositions is repeated 28 times to alternately deposit the A-layers and the B-layers to a total thickness of 0.45 μm to grown a p-type cladding layer, which is a multi-layered structure (supperlattice structure), is provided.

(p-Type Contact Layer 213)

Finally, at 1,050° C., a p-type contact layer of Mg-doped GaN is grown to a thickness of 150 Å on the p-type cladding layer. The p-type contact layer may be formed of a p-type semiconductor of $In_xAl_yGa_{1-x-y}N$ ($x \leq 0$, $y \leq 0$, $x+y \leq 1$), and preferably, when the p-type contact layer is made of Mg-doped GaN, the most desirable ohmic contact with the p-electrode can be established. After the deposition, the resulting composite is annealed to reduce the resistance of the p-type layers at 700° C. in a nitride atmosphere in a reaction chamber.

After the nitride semiconductor is grown on the GaN substrate as described above to fabricate a layered structure, the wafer is taken out from the reaction chamber and is provided with a protective layer of $SiO_2$ on the surface of the p-type contact layer, which is the uppermost layer of the wafer, by RIE (reactive ion etching) using $Cl_2$ gas to expose the surface of the n-type cladding layer. Simultaneously with the above, the W-shaped grooves are formed near the end surface of the light emitting side.

Next, in order to provide a stripe-shaped waveguide region, a protective layer of Si oxide (primarily $SiO_2$) is deposited to a thickness of 0.5 μm over substantially the entire surface of the p-type contact layer which is the uppermost layer by using a CVD apparatus. Then, a mask having a predetermined shape is disposed over the protective layer by employing photolithography, and etching is carried out by RIE apparatus using $CHF_3$ gas to form a protective layer made of a stripe-shaped Si oxide. Through the mask of the Si oxide protective layer, the semiconductor layer is etched by using $Cl_2$ gas and $SiCl_4$ gas, and the ridge stripe is formed above the active layer. At this time, the width of the ridge is adjusted to be 1.4 μm.

With the $SiO_2$ mask remained, a first insulating layer of $ZrO_2$ is formed over the surface of the p-type semiconductor layer to a thickness of 1000 Å. After the formation of the first insulating layer, the wafer is subjected to heat treatment at 600° C. When the first insulating layer is formed of a material other than $SiO_2$ as described above, the material used in the insulating layer can be stabilized by performing a heat treatment after the formation of the first insulating layer at 300° C. and above, preferably at between 400° C. and 1200° C. After the heat treatment, the wafer is immersed in a buffered liquid to dissolve and remove the $SiO_2$ layer on the ridge stripe and, thus, the $ZrO_2$ over the ridge stripe on the p-type contact layer is removed together with the $SiO_2$ by lift-off. Thus, the upper surface of the ridge stripe is exposed, but the side surfaces are covered with the $ZrO_2$.

Next, a p-electrode 230 made of Ni—Au is disposed on the p-type contact layer. The thickness of Ni layer is set to 100 Å and the thickness of Au layer is set to 1500 Å. Thereafter, a heat treatment is carrier out at 600° C. (omissible). Then, as a second insulating layer, $SiO_2$ is disposed on the side surfaces of the laser device. Further, as a p-pad electrode, Ni—Ti—Au is disposed sequentially on the p-electrode. Then, the GaN substrate is polished to a thickness of about 85 μm and a n-electrode of V—Pt—Au with respective layer thickness of 100 Å, 2000 Å and 3000 Å is stacked on the rear surface of the substrate.

Next, breaking is carried out from the nitride semiconductor layer side and bars are formed by cleavage. The cleaved surface of the nitride semiconductor layer is M plane (1-100) of the nitride semiconductor and this surface is used as the resonance plane.

(Dielectric Film 110)

A dielectric film is disposed over the end surface of the light emitting side of the bar-shaped nitride semiconductor fabricated as described above. To the end surface of the light emitting side, after cleaning the end surface of the resonator by using an ECR sputtering apparatus with plasma of an active gas such as oxygen, the first dielectric layer and second dielectric layer of $ZrO_2$, $Nb_2O_5$, $Al_2O_3$ and $TiO_2$ etc are disposed. In the present example, the dielectric film 110 is made of $Al_xO_y$. The first dielectric layer 111 is disposed to a thickness of 20 nm by using the metal target of 5N Al, the Ar flow rate of 15 sccm and the $O_2$ flow rate of 10 sccm, under the condition of the microwave power of 600 W and the RF of 600 W. Next, the second dielectric layer 112 is disposed to a thickness of 130 nm by using the metal target of 5N Al, the Ar flow rate of 10 sccm and the $O_2$ flow rate of 3 sccm, under the condition of the microwave power of 450 W and the RF of 450 W. In this case, the refractive index of the first dielectric layer to the light with a wavelength of 405 nm is 1.63 and the refractive index of the second dielectric layer is 1.67 (See, for example, FIG. 5(*b*))

(Dielectric Film 110')

Next, to the end surface of the light emitting side, after disposing a dielectric film 110' made of $Al_xO_y$, a reflecting mirror 310 containing $SiO_2$ and $ZrO_2$ is disposed.

The end surface of the reflection side is cleaned by using ECR sputtering apparatus with plasma of an active gas such as oxygen, the dielectric film 110' is disposed under the following conditions. A metal target Al is used for the source of Al. First, a protective layer made of $Al_2O_3$ is formed by disposing the first dielectric layer 111' to a thickness of 20 nm under the conditions of the Ar flow rate 15 sccm, the $O_2$ flow rate 10 sccm, the microwave power 600 W, and the RF 600 W, and then, disposing the second dielectric layer 112' to a thickness of 40 nm under the conditions of the Ar flow rate 10 sccm, the $O_2$ flow rate 3 sccm, the microwave power 450 W, and the RF 450 W. In this case, the refractive index of the first dielectric layer to the light with a wavelength of 405 nm is 1.63 and the refractive index of the second dielectric layer is 1.67.

Thereafter, a $SiO_2$ layer is disposed to a thickness of 67 nm by using the Si target and under the conditions of the Ar flow rate 20 sccm, the O$_2$ flow rate 7 sccm, the microwave power 500 W and the RF of 500 W. Next, a ZrO$_2$ layer is disposed to a thickness of 44 nm by using the Zr target and under the conditions of the Ar flow rate 20 sccm, the O$_2$ flow rate 27.5 sccm, the microwave power 500 W and the RF of 500 W. Under the above-described conditions, SiO$_2$ and ZrO$_2$ are alternately stacked six times to form the reflecting mirror 310.

Figure 9:
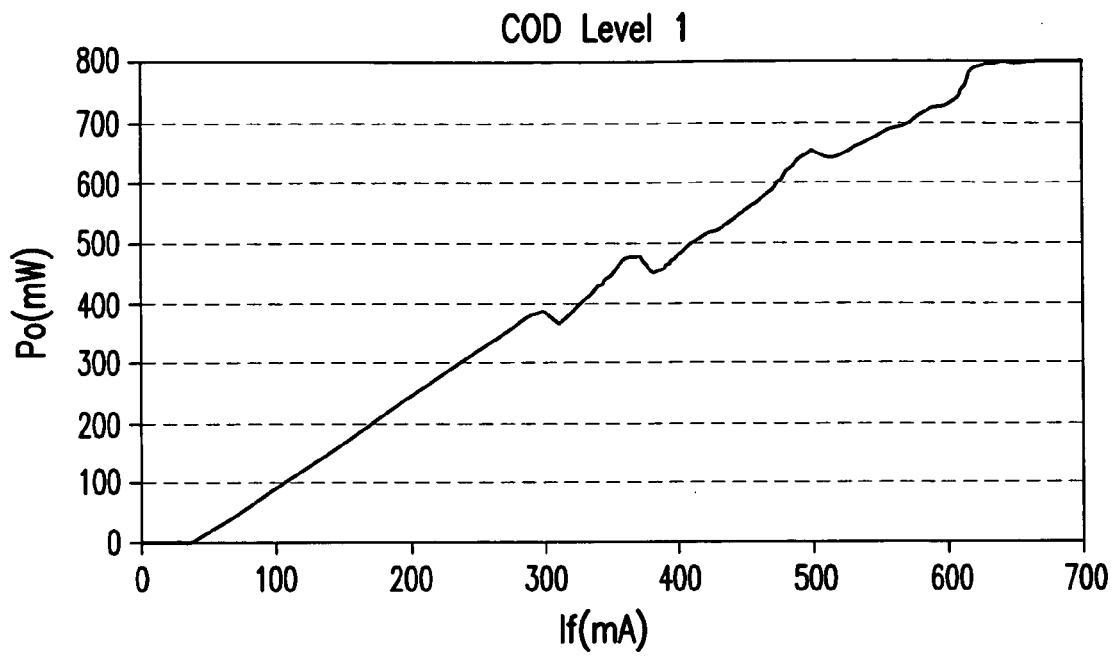
FIG. 9 is a graph showing a COD level of a nitride semiconductor laser device according to an embodiment of the present invention.
Figure 10:
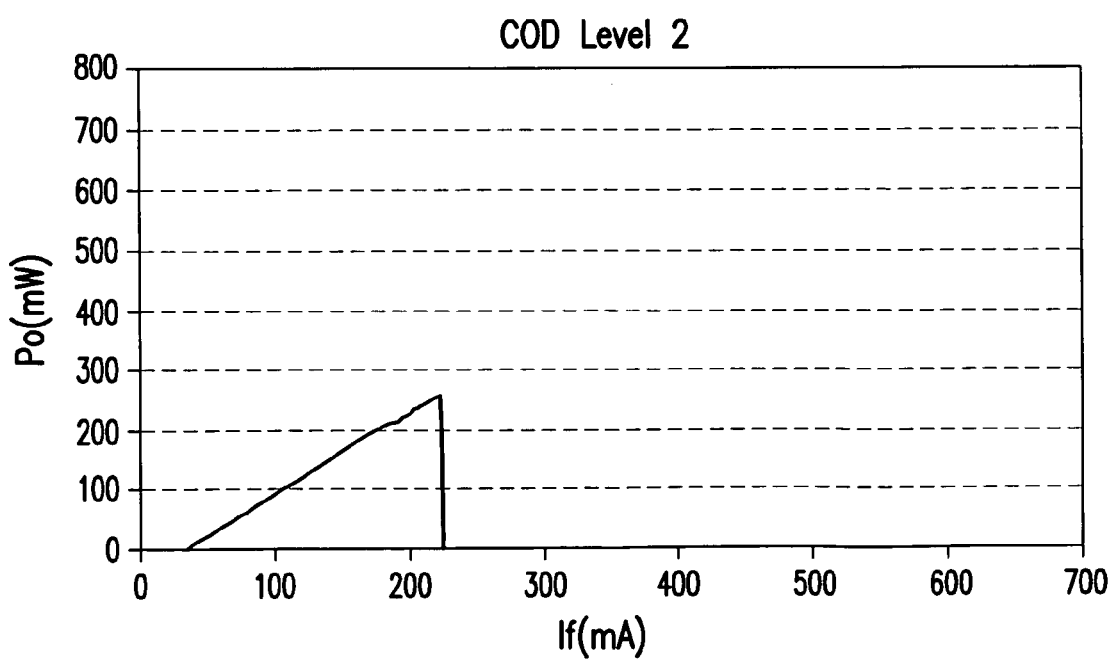
FIG. 10 is a graph showing a COD level of a conventional nitride semiconductor laser device.

Thereafter, the bar-shaped semiconductor is divided into chips to obtain the rectangular-shaped nitride semiconductor laser devices. The length of the resonator is adjusted to 600 μm and the width of the chip is set to 200 μm. The nitride semiconductor laser device thus obtained exhibits the COD level of 800 mW and above, as shown in FIG. 9. As a comparative example, the COD level of the nitride semiconductor laser device lacking the dielectric film of the present example is shown in FIG. 10. The Kink power of the nitride semiconductor laser device of the present example is approximately 400 mW. Life test (Tc=70° C., output power of 100 mW at CW) was performed and the result of 5000 hours and more was acquired. The nitride semiconductor laser device of the present example is capable of continuous oscillation at the oscillation wavelength of 405 nm, under the threshold current density of 3.5 kA/cm$^2$, and the high power output of 150 mW with CW drive at room temperature.

EXAMPLE 2

A nitride semiconductor laser device is fabricated in a similar manner as in Example 1, except that the dielectric film 110 of the end surface of the light emitting side is constructed as below. A ECR sputtering apparatus is used. After cleaning the end surface of the light emitting side by using plasma of an active gas such as oxygen, a first dielectric layer and a second dielectric layer made of Al$_x$O$_y$ are formed. First, the first dielectric layer is disposed to a thickness of 20 nm by using the metal target of 5N Al, under the conditions of the Ar flow rate 15 sccm, the O$_2$ flow rate of 10 sccm, the microwave power of 600 W, and the RF of 600 W. Then, using the metal target of 5N Al, the second dielectric layer is disposed to a thickness of 100 nm, under the conditions of the Ar flow rate 10 sccm, the O$_2$ flow rate of 3 sccm, the microwave power of 450 W, and the RF of 450 W. In this case, the refractive index of the first dielectric layer to the light with a wavelength of 405 nm is 1.63 and the refractive index of the second dielectric layer is 1.67. The nitride semiconductor laser device thus obtained exhibits approximately the same properties as in Example 1.

EXAMPLE 3

A nitride semiconductor laser device is fabricated in a similar manner as in Example 1, except that the dielectric film is constructed as below.

The end surface of the light emitting side is cleaned by using ECR sputtering apparatus with plasma of an active gas such as oxygen, using 5N Al as the metal target and under the conditions of Ar flow rate 15 sccm, the O$_2$ flow rate 10 sccm, the microwave power 600 W, and the RF 600 W, a first dielectric layer 111 is disposed to a thickness of 20 nm and then, using 5N Al as the metal target and under the conditions of Ar flow rate 10 sccm, the O$_2$ flow rate 3 sccm, the microwave power 450 W, and the RF 450 W, a second dielectric layer is disposed to a thickness of 40 nm to form a dielectric film 110. In this case, the refractive index of the first dielectric layer to the light with a wavelength of 405 nm is 1.63 and the refractive index of the second dielectric layer is 1.67.

Thereafter, a Al$_2$O$_3$ layer is disposed to a thickness of 60 nm by using Al as the metal target and under the conditions of the Ar flow rate 10 sccm, the O$_2$ flow rate 3 sccm, the microwave power 450 W and the RF of 450 W. Thereafter, a ZrO$_2$ layer is disposed to a thickness of 44 nm by using the target made of Zr and under the conditions of the Ar flow rate 20 sccm, the O$_2$ flow rate 27.5 sccm, the microwave power 500 W and the RF of 500 W. Under the above-described conditions, Al$_2$O$_3$ and ZrO$_2$ are alternately stacked twice to form the reflecting mirror 310.

Next, to the end surface of the light emitting side, after cleaning the end surface of the resonator by using an ECR sputtering apparatus with plasma of an active gas such as oxygen, using Al as the metal target and under the conditions of Ar flow rate 15 sccm, the O$_2$ flow rate 10 sccm, the microwave power 600 W, and the RF 600 W, a first dielectric layer 111 is disposed to a thickness of 20 nm and then, using Al as the metal target and under the conditions of Ar flow rate 10 sccm, the O$_2$ flow rate 3 sccm, the microwave power 450 W, and the RF 450 W, a second dielectric layer 112' is disposed to a thickness of 40 nm, to form a dielectric film 110' made of Al$_2$O$_3$.

Thereafter, using Al as the metal target and under the conditions of the Ar flow rate 10 sccm, the O$_2$ flow rate 3 sccm, the microwave power 450 W and the RF of 450 W, a layer having low refractive index is disposed to a thickness of 60 nm. Thereafter, using Zr as the metal target and under the conditions of the Ar flow rate 20 sccm, the O$_2$ flow rate 27.5 sccm, the microwave power 500 W and the RF of 500 W, a layer having high refractive index is disposed to a thickness of 44 nm. Under the above-described conditions, Al$_2$O$_3$ and ZrO$_2$ are alternately stacked six times to form the reflector 310.

Thereafter, the bar-shaped semiconductor is divided into chips to obtain the rectangular-shaped nitride semiconductor laser devices having the length of the resonator 300 μm and the width of the chip 200 μm. The nitride semiconductor laser device thus obtained exhibits the COD level of 350 mW or higher and the kink power of 100 mW. Life test (Tc=70° C., output power of 20 mW at CW) was performed and the result of 20000 hours and more was obtained. The nitride semiconductor laser device of the present example is capable of continuous oscillation at the oscillation wavelength of 405 nm, under the threshold current density of 4.2 kA/cm$^2$, and the high power output of 50 mW with CW drive at room temperature.

EXAMPLE 4

A nitride semiconductor laser device is fabricated in a similar manner as in Example 1, except that the dielectric film at the end surface of the light reflection side is constructed as below.

The end surface of the light emitting side is cleaned by using ECR sputtering apparatus with plasma of an active gas such as oxygen, under the conditions of Ar flow rate 15 sccm, the O$_2$ flow rate 10 sccm, the microwave power 600 W, and the RF 600 W, a first dielectric layer is disposed to a thickness of 20 nm and then, under the conditions of Ar flow rate 10 sccm, the O$_2$ flow rate 3 sccm, the microwave power 450 W, and the RF 450 W, a second dielectric layer is disposed to a thickness of 40 nm, to form a dielectric layer made of Al$_2$O$_3$. In this case, the refractive index of the first dielectric layer to the light with a wavelength of 405 nm is approximately 1.63 and the refractive index of the second dielectric layer is approximately 1.67.

Next, using a magnetron sputtering apparatus, $SiO_2$ is disposed to a thickness of 67 nm under the conditions of the Ar flow rate 50 sccm, the $O_2$ flow rate 5 sccm, and the RF of 500 W to form a layer having low refractive index. Thereafter, $ZrO_2$ is disposed to a thickness of 46 nm under the conditions of the Ar flow rate 50 sccm, the $O_2$ flow rate 10 sccm, and the RF of 500 W to form a layer having high refractive index. Under the above-described conditions, $SiO_2$ and $ZrO_2$ are alternately stacked six times to form the reflecting mirror 310. The nitride semiconductor laser device thus obtained exhibits approximately the same properties as in Example 1.

EXAMPLE 5

A nitride semiconductor laser device is fabricated in a similar manner as in Example 1, except that the dielectric film at the end surface of the light reflecting side is constructed as below.

The first dielectric layer with a thickness of 200 Å, the second dielectric layer with a thickness of 1000 Å, and $ZrO_2$ with a thickness of 440 Å are disposed and then, seven pairs of layers of a 600 Å of $Al_2O_3$ and a 440 Å of $ZrO_2$ are disposed. Then, finally, $Al_2O_3$ is disposed with a thickness of 1200 Å. The nitride semiconductor laser device thus obtained has excellent life performance properties.

EXAMPLE 6

A nitride semiconductor laser device is fabricated in a similar manner as in Example 1, except that the dielectric film at the end surface of the light reflection side is constructed as below.

The first dielectric layer with a thickness of 200 Å, the second dielectric layer with a thickness of 1000 Å, and $ZrO_2$ with a thickness of 440 Å are disposed and then, seven pairs of layers of a 600 Å of $Al_2O_3$ and a 440 Å of $ZrO_2$ are disposed. Then, finally, $Al_2O_3$ with a thickness of 1000 Å and AlN with a thickness of 200 Å are disposed. The nitride semiconductor laser device thus obtained has excellent life performance properties (life period).

EXAMPLE 7

A nitride semiconductor laser device is fabricated in a similar manner as in Example 1, except that the dielectric film at the end surface of the light reflecting side is constructed as below.

To the front end surface, the first dielectric layer with a thickness of 200 Å, the second dielectric layer with a thickness of 800 Å are disposed in sequence, and further, a dielectric layer with a thickness of 200 Å is disposed thereon under the same conditions as in the deposition of the first dielectric layer. The nitride semiconductor laser device thus obtained has excellent life performance properties.

INDUSTRIAL APPLICABILITY

The semiconductor laser device according to the present invention can be utilized in the areas such as optical discs, optical communication systems, printers, exposure usages and measurement systems. The semiconductor laser device according to the present invention can also be utilized for excitation light sources in biotechnological field, in which presence or location of a substance sensitive to a specific wavelength can be detected by irradiating the beam from the semiconductor thereto. Further, the semiconductor laser device of the present invention can also be utilized as a luminous source for medical equipments and displays.

It is to be understood that although the present invention has been described with regard to preferred embodiments thereof, various other embodiments and variants may occur to those skilled in the art, which are within the scope and spirit of the invention, and such other embodiments and variants are intended to be covered by the following claims.

What is claimed is:

1. A semiconductor laser device comprising:
   an optical resonator including a semiconductor layer; and
   a dielectric film on at least one end surface of the optical resonator,
   wherein the dielectric film comprises a first dielectric layer and a second dielectric layer that contain the same elements and are disposed in sequence from the end surface side of the semiconductor layer,
   the first dielectric layer includes a layer made of a single crystal material,
   the second dielectric layer includes a layer made of an amorphous material, and
   the first dielectric layer and the second dielectric layer have approximately the same composition ratio.

2. A semiconductor laser device comprising:
   an optical resonator including a semiconductor layer; and
   a dielectric film on at least one end surface of the optical resonator,
   wherein the dielectric film comprises a first dielectric layer and a second dielectric layer that contain the same elements and are disposed in sequence from the end surface side of the semiconductor layer,
   the first dielectric layer is a reaction preventing layer that prevents a reaction between the semiconductor layer and the dielectric film, and
   the second dielectric layer is a reflecting layer for a laser beam.

3. The semiconductor laser device according to claim 2, wherein the first dielectric layer includes a layer which comprises a single crystal material and the second dielectric layer, includes a layer made of an amorphous material.

4. The semiconductor laser device according to any one of claims 1 to 3, wherein the first dielectric layer has a lower refractive index than that of the second dielectric layer.

5. The semiconductor laser device according to claim 4, wherein the second dielectric layer has a larger thickness than that of the first dielectric layer.

6. The semiconductor laser device according to claim 1 or 2, wherein a reflectance of the dielectric film is 25% or less.

7. The semiconductor laser device according to claim 4, wherein the dielectric film has a reflectance of 20% or less when an oscillation wavelength of the semiconductor laser device is approximately 400 nm.

8. The semiconductor laser device according to claim 4, wherein the first dielectric layer and the second dielectric layer contain aluminum and oxygen as constituent elements.

9. The semiconductor laser device according to claim 4, wherein the first dielectric layer and the second dielectric layer have approximately the same expansion coefficient.

10. The semiconductor laser device according to claim 1 or 2, wherein the dielectric film has an outermost layer which comprises a nitride.

11. A semiconductor laser device comprising:
    an optical resonator including a semiconductor layer; and
    a dielectric film on at least one end surface of the optical resonator, wherein
    the dielectric film comprises a first dielectric layer, a second dielectric layer, and a third dielectric layer disposed on the end surface side of the semiconductor layer in sequence from the end surface side of the semiconductor layer;

the first dielectric layer and the second dielectric layer are comprised of the same elements;

the third dielectric layer contains an element different from the element in the first dielectric layer and the second dielectric layer;

the first dielectric layer is a reaction preventing layer which prevents a reaction between the semiconductor layer and the dielectric film; and the second dielectric layer is a stress relaxation layer which reduces stress between the first dielectric layer and the third dielectric layer.

12. The semiconductor laser device according to claim 11, wherein the first dielectric layer and the second dielectric layer contain oxygen.

13. The semiconductor laser device according to claim 12, wherein the first dielectric layer has a higher oxygen content than that of the second dielectric layer.

14. The semiconductor laser device according to claim 11, wherein the dielectric film has an outermost layer which comprises a nitride.

15. The semiconductor laser device according to claim 1, wherein the composition ratio of the elements used to form the first and second dielectric layers is within seven percent.

16. An optical pickup device comprising the semiconductor laser device according to claim 1.

17. A device for optically reading information stored on a media by condensing a laser beam generated by a semiconductor laser device on the media and detecting the laser beam reflected on the media so as to read the information, wherein the semiconductor laser device is the semiconductor laser device according to claim 1.

18. The semiconductor laser device according to claim 1, wherein said optical resonator includes at least two semiconductor layers.

19. The semiconductor laser device according to claim 2, wherein said optical resonator includes at least two semiconductor layers.

20. The semiconductor laser device according to claim 11, wherein said optical resonator includes at least two semiconductor layers.

* * * * *